(12) United States Patent
Shaanan et al.

(10) Patent No.: US 7,903,745 B2
(45) Date of Patent: Mar. 8, 2011

(54) ERROR DETECTION AND CORRECTION FOR BASE-BAND WIRELESS SYSTEMS

(75) Inventors: Tamir Shaanan, Herzlia (IL); Lev Freilicher, Netanya (IL)

(73) Assignee: Infra-Com Ltd. (IL)

( * ) Notice: Subject to any disclaimer, the term of this patent is extended or adjusted under 35 U.S.C. 154(b) by 1066 days.

(21) Appl. No.: 11/573,313

(22) PCT Filed: Nov. 24, 2005

(86) PCT No.: PCT/IL2005/001252
§ 371 (c)(1),
(2), (4) Date: Feb. 6, 2007

(87) PCT Pub. No.: WO2006/072935
PCT Pub. Date: Jul. 13, 2006

(65) Prior Publication Data
US 2008/0112491 A1    May 15, 2008

Related U.S. Application Data

(60) Provisional application No. 60/641,887, filed on Jan. 6, 2005.

(51) Int. Cl.
*H04B 14/04* (2006.01)
(52) U.S. Cl. ........................................ 375/253
(58) Field of Classification Search ............ 341/58, 341/59, 106; 370/252, 442, 503; 375/253
See application file for complete search history.

(56) References Cited

U.S. PATENT DOCUMENTS

| | | | |
|---|---|---|---|
| 5,767,798 | A | 6/1998 | Won |
| 6,018,304 | A | 1/2000 | Bessior |
| 6,104,324 | A | 8/2000 | Kim |
| 6,188,336 | B1 | 2/2001 | Kim |
| 6,236,340 | B1 | 5/2001 | Patapoutian |
| 6,259,384 | B1 | 7/2001 | McEwen |
| 6,281,815 | B1 | 8/2001 | Shim |
| 6,600,431 | B1 | 7/2003 | Shim |

(Continued)

FOREIGN PATENT DOCUMENTS
GB    2315650    2/1998

OTHER PUBLICATIONS

Park et al.,"Modulation Analysis for Wireless Infrared Communications", Proceedings of the Conference on Communications, Seattle, Jun. 18-22, 1995.

(Continued)

*Primary Examiner* — David C Payne
*Assistant Examiner* — Leon-Viet Q Nguyen
(74) *Attorney, Agent, or Firm* — Galbreath Law Office, P.C.; John A. Galbreath

(57) ABSTRACT

A method of encoding, transmitting and decoding data over a wireless medium, including, selecting a number of bits N representing a symbol, creating a set of at least 2 to the power of N equal sized codewords with a larger number of bits than N, representing the 2 to the power of N possible combinations of N bit symbols, receiving a stream of data, replacing every N bit symbol from the stream of data with its representative codeword from the created set, transmitting the codewords using a faster transmission bit rate such that the transmission time allocated for each codeword is substantially the same as the time duration required to transmit the original bits it replaced.

18 Claims, 5 Drawing Sheets

U.S. PATENT DOCUMENTS

| | | |
|---|---|---|
| 6,697,311 B1 | 2/2004 | Kim |
| 2002/0150118 A1* | 10/2002 | Zinke et al. .......... 370/442 |
| 2002/0186153 A1 | 12/2002 | Hayami |
| 2008/0043779 A1* | 2/2008 | Taha et al. .......... 370/503 |

OTHER PUBLICATIONS

Infrared Data Association, "Infrared Data Association Serial Infrared Physical Layer Specification", Version 1.4 (Online), May 30, 2001.

Ananth et al., "Low Voltage Infrared Transceiver Design", Communications Systems Design, Oct. 1997.

Kahn et al., "Wireless Infrared Communications", Proceedings of the IEEE, Feb. 1997.

Schutti, "Infrared Communications Using the IrDA Standard", Infrared Data Association, Oct. 1, 2003.

Shiu et al., "Differential Pulse Position Modulation for Power-Efficient Optical Communication", IEEE Transactions on Communications, Aug. 1997.

* cited by examiner

| 2 BIT SYMBOL | 6 SUPER-BITS | 18 CHIPS |
| --- | --- | --- |
| 00 | 010000 | 000 010 000 000 000 000 |
| 01 | 001001 | 000 000 010 000 000 010 |
| 10 | 100100 | 010 000 000 010 000 000 |
| 11 | 101010 | 010 000 010 000 010 000 |

Fig. 3

| Received encoded signal on the level of a Super-Bit | | | | | | Quantity of errors for the 4 symbols | | | | Decision according to |
|---|---|---|---|---|---|---|---|---|---|---|
| SB1 | SB2 | SB3 | SB1 | SB5 | SB6 | 00 | 01 | 10 | 11 | minimal errors |
| 0 | 0 | 0 | 0 | 0 | 0 | 1 | 2 | 2 | 3 | 00 |
| 0 | 0 | 0 | 0 | 0 | 1 | 2 | 1 | 3 | 4 | 01 |
| 0 | 0 | 0 | 0 | 1 | 0 | 2 | 3 | 3 | 2 | ?? → 00 |
| 0 | 0 | 0 | 0 | 1 | 1 | 2 | 2 | 4 | 3 | ?? → 00 |
| 0 | 0 | 0 | 1 | 0 | 0 | 2 | 3 | 1 | 4 | 10 |
| 0 | 0 | 0 | 1 | 0 | 1 | 3 | 2 | 2 | 5 | ?? → 00 |
| 0 | 0 | 0 | 1 | 1 | 0 | 3 | 4 | 2 | 3 | ?? → 00 |
| 0 | 0 | 0 | 1 | 1 | 1 | 4 | 3 | 3 | 4 | ?? → 00 |
| 0 | 0 | 1 | 0 | 0 | 0 | 2 | 1 | 3 | 2 | 01 |
| 0 | 0 | 1 | 0 | 0 | 1 |   | 0 |   |   | 01 |
| 0 | 0 | 1 | 0 | 1 | 0 | 3 | 2 | 4 | 1 | 11 |
| 0 | 0 | 1 | 0 | 1 | 1 | 4 | 1 | 5 | 2 | 01 |
| 0 | 0 | 1 | 1 | 0 | 0 | 3 | 2 | 2 | 3 | ?? → 00 |
| 0 | 0 | 1 | 1 | 0 | 1 | 4 | 1 | 3 | 4 | 01 |
| 0 | 0 | 1 | 1 | 1 | 0 | 4 | 3 | 3 | 2 | ?? → 00 |
| 0 | 0 | 1 | 1 | 1 | 1 | 4 | 2 | 4 | 3 | ?? → 00 |
| 0 | 1 | 0 | 0 | 0 | 0 | 0 |   |   |   | 00 |
| 0 | 1 | 0 | 0 | 0 | 1 | 1 | 2 | 4 | 5 | 00 |
| 0 | 1 | 0 | 0 | 1 | 0 | 1 | 4 | 4 | 3 | 00 |
| 0 | 1 | 0 | 0 | 1 | 1 | 2 | 3 | 5 | 4 | ?? → 00 |
| 0 | 1 | 0 | 1 | 0 | 0 | 1 | 4 | 2 | 5 | 00 |
| 0 | 1 | 0 | 1 | 0 | 1 | 2 | 3 | 3 | 6 | ?? → 00 |
| 0 | 1 | 0 | 1 | 1 | 0 | 2 | 4 | 3 | 4 | ?? → 00 |
| 0 | 1 | 0 | 1 | 1 | 1 | 3 | 4 | 4 | 5 | ?? → 00 |
| 0 | 1 | 1 | 0 | 0 | 0 | 1 | 2 | 4 | 3 | 00 |
| 0 | 1 | 1 | 0 | 0 | 1 | 2 | 1 | 5 | 4 | 01 |
| 0 | 1 | 1 | 0 | 1 | 0 | 2 | 3 | 5 | 2 | ?? → 00 |
| 0 | 1 | 1 | 0 | 1 | 1 | 3 | 2 | 6 | 3 | ?? → 00 |
| 0 | 1 | 1 | 1 | 0 | 0 | 2 | 3 | 3 | 4 | ?? → 00 |
| 0 | 1 | 1 | 1 | 0 | 1 | 3 | 2 | 4 | 5 | ?? → 00 |
| 0 | 1 | 1 | 1 | 1 | 0 | 3 | 4 | 4 | 3 | ?? → 00 |
| 0 | 1 | 1 | 1 | 1 | 1 | 4 | 3 | 5 | 4 | ?? → 00 |
| 1 | 0 | 0 | 0 | 0 | 0 | 2 | 3 | 1 | 2 | 10 |
| 1 | 0 | 0 | 0 | 0 | 1 | 3 | 2 | 2 | 3 | ?? → 00 |
| 1 | 0 | 0 | 0 | 1 | 0 | 3 | 4 | 2 | 1 | 11 |
| 1 | 0 | 0 | 0 | 1 | 1 | 4 | 3 | 3 | 2 | ?? → 00 |
| 1 | 0 | 0 | 1 | 0 | 0 |   |   | 0 |   | 10 |
| 1 | 0 | 0 | 1 | 0 | 1 | 4 | 3 | 1 | 4 | 10 |
| 1 | 0 | 0 | 1 | 1 | 0 | 4 | 5 | 1 | 2 | 10 |
| 1 | 0 | 0 | 1 | 1 | 1 | 5 | 4 | 2 | 3 | ?? → 00 |
| 1 | 0 | 1 | 0 | 0 | 0 | 3 | 2 | 2 | 1 | 11 |
| 1 | 0 | 1 | 0 | 0 | 1 | 4 | 1 | 3 | 2 | 01 |
| 1 | 0 | 1 | 0 | 1 | 0 |   |   |   | 0 | 11 |
| 1 | 0 | 1 | 0 | 1 | 1 | 5 | 2 | 4 | 1 | 11 |
| 1 | 0 | 1 | 1 | 0 | 0 | 4 | 3 | 1 | 2 | 10 |
| 1 | 0 | 1 | 1 | 0 | 1 | 5 | 2 | 2 | 3 | ?? → 00 |
| 1 | 0 | 1 | 1 | 1 | 0 | 5 | 4 | 2 | 1 | 11 |
| 1 | 0 | 1 | 1 | 1 | 1 | 6 | 3 | 3 | 2 | ?? → 00 |
| 1 | 1 | 0 | 0 | 0 | 0 | 1 | 4 | 2 | 3 | 00 |
| 1 | 1 | 0 | 0 | 0 | 1 | 2 | 3 | 3 | 4 | ?? → 00 |
| 1 | 1 | 0 | 0 | 1 | 0 | 2 | 5 | 3 | 2 | ?? → 00 |
| 1 | 1 | 0 | 0 | 1 | 1 | 3 | 4 | 4 | 3 | ?? → 00 |
| 1 | 1 | 0 | 1 | 0 | 0 | 2 | 5 | 1 | 4 | 10 |
| 1 | 1 | 0 | 1 | 0 | 1 | 3 | 4 | 2 | 5 | ?? → 00 |
| 1 | 1 | 0 | 1 | 1 | 0 | 3 | 6 | 2 | 3 | ?? → 00 |
| 1 | 1 | 0 | 1 | 1 | 1 | 4 | 5 | 3 | 4 | ?? → 00 |
| 1 | 1 | 1 | 0 | 0 | 0 | 2 | 3 | 3 | 2 | ?? → 00 |
| 1 | 1 | 1 | 0 | 0 | 1 | 3 | 2 | 4 | 3 | ?? → 00 |
| 1 | 1 | 1 | 0 | 1 | 0 | 3 | 4 | 4 | 1 | 11 |
| 1 | 1 | 1 | 0 | 1 | 1 | 4 | 3 | 5 | 2 | ?? → 00 |
| 1 | 1 | 1 | 1 | 0 | 0 | 3 | 4 | 2 | 3 | ?? → 00 |
| 1 | 1 | 1 | 1 | 0 | 1 | 4 | 3 | 3 | 4 | ?? → 00 |
| 1 | 1 | 1 | 1 | 1 | 0 | 4 | 5 | 3 | 2 | ?? → 00 |
| 1 | 1 | 1 | 1 | 1 | 1 | 5 | 4 | 4 | 3 | ?? → 00 |

ERROR DETECTION AND CORRECTION FOR BASE-BAND WIRELESS SYSTEMS

RELATED APPLICATIONS

The application claims priority from U.S. provisional application No. 60/641,887 filed on Jan. 6, 2005.

FIELD OF THE INVENTION

The present invention relates generally to a robust method of encoding and decoding wireless transmissions.

BACKGROUND OF THE INVENTION

The use of wireless communication between different parts of a device and/or different devices has many advantages. Wireless communication simplifies installation. It eliminates the need to layout cables or wires between the devices, as well as identify and hook up to specific connection sockets. It allows greater freedom in positioning of the device, and the use of mobile or hand held devices. Some examples of such devices are a remote control for a TV (or other device), a computer and its input and/or output peripheral devices (e.g. mouse, keyboard, screen, printer) and an audio source device and its respective surround speakers.

Commonly, wireless devices use RF (radio frequency) or IR (Infrared) technology. In some characteristics RF has advantages over IR, and in some characteristics IR has advantages over RF. Typically, RF is able to support longer range transmissions and transmissions through walls and other opaque objects. This is useful for devices such as a wireless (cordless) telephone, which can be used throughout a house, or for wireless computer networks. In contrast IR is generally limited to a single room or enclosure. IR transmissions are reflected and scattered by various objects and surfaces. IR transmissions penetrate glass but do not penetrate walls. Typically, IR suffers less interference than RF, as it uses an optical carrier for transmission over the wireless medium. It especially almost has zero interference from devices outside the room or enclosure it operates in. IR is more secure since it is less susceptible to eaves dropping from outside the enclosure. These characteristics make it ideal for devices that function in a single room/enclosure, for example remote controls, input and output peripheral devices of a computer, wireless speakers for home theater systems as well as wireless video systems (like digital TV).

In applying IR wireless communication, there could be a few types of implementations. There are implementations wherein the transceivers (transmitter & receiver) need to be aimed one towards the other (referred to as direct IR), and there are implementations wherein the transceivers do not need to be aimed one towards the other (referred to as non-direct IR). There are implementations that require keeping a non-blocked line of site (LOS) between the communicating transceivers, and there are implementations, which do not require a non-blocked line of site (LOS) between the communicating transceivers (although they might require to be directed toward the other transceivers). A connection which is simultaneously non-direct and non-LOS is referred to as diffused connection. A diffused connection is the most flexible, since it allows a relatively loose deployment of the transceivers around a room or an enclosure. On the other hand a diffused connection typically requires larger power emission from the transmitter part of the transceiver, as the diffused infrared signal suffers greater losses than direct and line of sight wireless optical communication systems.

It should be noted that although IR transmissions are generally free from commonly known RF interferences, they might still be affected by natural and artificial ambient light sources such as sunlight, plasma TV emissions and electronic ballast florescent lamps. In a base-band wireless optical communication system, communication is usually governed by sending short pulses (that mimic ON ('1') and OFF ('0') 'bit' values) over the wireless medium. Typically, such ambient light sources, through optical and electronic noise interference mechanisms, can cause a '1 (ON) bit value to be shifted over by one fall bit position to an adjacent bit position (either left or right) causing a '1' (ON) bit value to be detected as a '0' (OFF) bit value, and an adjacent '0' (OFF) bit value to be detected as a '1' (ON) bit value (e.g. two errors). This can be referred to as a full bit position jitter. Similar phenomenon can occur in multipath propagation infrared systems, especially in diffused connections or channels, which suffer from multiple diffuse reflections. This phenomenon is usually known as inter symbol interference, or ISI. Additionally, IR signal strength over the detector plane in the receiver part of the transceiver is dependent on the distance and geometry of the optical path (e.g. direct, reflected) between the communicating transceivers. The larger the distance and/or the number of bounces the optical signal needs to traverse between the transmitter and receiver, the more susceptible the link is to errors, as signal strength typically degrades as the square of the distance. As an example, a '1' (ON) bit value may arrive so weak at the receiver it will erroneously be detected as a '0' (OFF) bit value by that receiver's detection circuitry. This is referred to as pulse erasure. Similarly, a '0' (OFF) bit value may be affected in such a way by added noise and interference causing it to erroneously be detected as a '1' (ON) bit value. This is referred to as a foreign pulse.

Typically, direct transmission of the raw communication data as binary bits (pulses) like in simple on-off keying (OOK) base-band modulation is problematic, since various reception circuits (e.g. a high pass filter that is used in the receiver device to filter out low frequency noise) tend to have difficulty in dealing with long consecutive sequences of '1' (ON) or '0' (OFF) bit values. In order to overcome this problem, it is common practice to encode the raw binary data using various, more sophisticated, base-band modulation techniques, for example: Manchester modulation, L-Ary pulse position modulation (LPPM) or differential PPM (DPPM) as well as run length limited (RLL) modulation techniques. In these techniques, for any incoming raw communication data, the length of consecutive '1' (ON) and '0' (OFF) bit values has a certain predetermined value.

Various types of PPM, and related or similar methods, are referred to as a base-band modulation techniques since the raw data bits are converted or mapped directly into another modulated signal with an ON pulse representing a '1' bit value, and the lack of an ON pulse representing a '0' bit value. In base-band modulation techniques the raw data bits are not modulated on a high frequency based carrier as is typically performed in RF wireless systems. PPM is an orthogonal base-band modulation technique that offers a decrease in average power requirement compared to OOK, at the expense of an increased bandwidth requirement. In PPM, a fixed number of bits N, termed as a symbol, with $2^N$ (2 to the power of N) possible values, are encoded by dividing the time duration of the N bit symbol to $2^N$ time positions, referred to as chips, and transmitting a pulse (e.g., a '1' value chip) in one of the time positions (chips) of the signal representing the original N bit symbol. As an example, a 2-bit symbol with 4 possible values (e.g. '00', '01', '10' and '11') is represented by 4 half-bit time positions (chips), wherein each position directly represents one of the 4 possible symbol values. Likewise 4-bit symbols with $2^4=16$ possible values (e.g. '0000', '0001', '0010', ..., '1111') are represented by 16 quarter-bit time positions (chips), wherein each position directly represents one of the 16 possible symbol values.

The use of PPM modulation results in a single short pulse ('1' chip value) within the overall time duration of any possible value of the N bit symbol. For example, a 4-bit symbol '0000' is represented by a single short pulse at the first position of the train of the 16 possible chip positions, and '1111' is represented by a single short pulse in the last position of the train of 16 possible chip positions. The converted representation from raw data symbols to base-band modulated chips is generally referred to as a codeword representing the original set of bits (or symbol).

A PPM modulated codeword has the same time duration as the original raw data symbol, however the energy required for transmission over the wireless medium is typically reduced since all possible symbol values are represented by a single short pulse (chip), for example '1111' is represented by a short pulse ('1'), which is a sixteenth of the size (in time and energy) of the original raw data symbol ('1111'). Additionally, each symbol, after mapping to a PPM codeword comprises a single pulse (chip), which is easier to handle by the receiver device, in contrast to the original bit representation which can have no pulse ('0000') or varying length pulses (e.g. '1100') according to the raw data bit values.

In systems where the transmissions are transmitted to multiple receivers, and/or are needed for taking immediate action, like in real time streaming media devices (e.g. feeding the next device in the track with the streaming type communication), it is generally not feasible to implement a simple system to request retransmission if transmissions are received erroneously. Typically, error detection methods can be used to recognize that a transmission has an error, for example by transmitting a CRC or checksum field, which is used to authenticate the transmitted data, and if a discrepancy is detected it is evidence of the existence of an error. In more advanced techniques, referred to as forward error correction (FEC) methods, extra redundant data is transmitted (e.g. typically a set of parity bits) to allow detection of some errors and correction of part of these errors. Typically, the extent of redundancy to be used in the FEC technique depends on the characteristics of the wireless transmission channel, the specific modulation technique used, and the acceptable specified wireless system bit error rate (BER) over the wireless medium.

Generally, when transmitting base-band (e.g. pulsed) infrared wireless transmissions, the greater the distance between the communicating transceivers, or the noisier the environment (e.g. direct sunlight, artificial light sources), the greater the number of errors that are manifested within the originally sent wireless signal. Typically, overcoming transmission errors (up to a certain extent) requires retransmission of data, when an error occurs, or transmission of extra redundancy bits to facilitate a forward error correction scheme. Retransmission of data from the transmitter severely degrades the effective bandwidth of the wireless link, and limits the implementation feasibility of wireless infrared systems, especially for streaming type of systems like wireless audio and video systems.

SUMMARY OF THE INVENTION

An aspect of an embodiment of the invention relates to a system and method of encoding data for transmission over a wireless optical link, which allows detection and correction of errors in the transmitted data at the receiver using a decoder, thus providing a more robust wireless optical communication system. Optionally, the encoding method enables extension of the operational range of the optical wireless communication system, and/or its use in noisier environments.

In an exemplary embodiment of the invention, the encoding method replaces a selected number of bits from a stream of raw data bits with a larger number of shorter bits (termed chips) thus forming a codeword. The encoding method modulates the codewords for transmission over the wireless medium, such that the duration of transmission of each codeword takes the same time as the original raw data bits, which it replaces.

In an exemplary embodiment of the invention, a codeword enables the receiver's decoder to detect and correct errors within codewords and then demodulate the codewords into the originally sent symbols, wherein the error is a single inverted chip in the codeword. In some embodiments of the invention, errors of more than one inverted chip may be corrected.

In an exemplary embodiment of the invention, any full chip position jitter in a codeword, wherein such jitter is characterized by a single '1' value chip that shifts position to the chip position on its left or right sides, is correctable by the receiver's decoder.

In an exemplary embodiment of the invention, the system and method used is an integrated modulation and error correction encoding technique implemented in the transmitter of the transceiver producing a codeword for transmission, and an integrated de-modulation and error correction decoding technique implemented in the receiver of the transceiver producing the corrected original symbol or an error indication if error detection and correction is not achievable.

In some embodiments of the invention N bit symbols are replaced by associated codewords, wherein N is 2 bits, 3 bits, 4 bits or more than 4 bits. In an exemplary embodiment of the invention, a set of 2 to the power of N codewords are created for mapping all the possible combinations of the N bit symbols to codewords. In some embodiments of the invention additional, special, non-data codewords are used for the transfer of control information.

In an exemplary embodiment of the invention, each codeword is constructed from an integer number of elements (referred to herein as super-bits) comprising three chips of the form '000' or '010'. The form '000' is referred to as a zero ('0') value super-bit, and the form '010' is referred to as a one ('1') value super-bit.

In an exemplary embodiment of the invention, each codeword comprises at least one '1' value super-bit. Optionally, none of the codewords have two successive '1' value super-bits.

In an exemplary embodiment of the invention, all codewords have the same number of '1' value super-bits.

In an exemplary embodiment of the invention, all codewords have the same number of super-bits. Optionally, the selected number of '1' value super-bits in the aggregate set of code-words associated with the $2^N$ N bit original symbols is the minimum number that can meet the following limitations:

1. Each codeword comprises at least one '1' value super-bit.

2. None of the codewords have two successive '1' value super-bits.

3. Each code-word of the set of code-words differs from the other code-words such that at least three chip inversions are required for one code word to turn into another (referred to as a Hamming Distance of 3).

There is thus provided according to an exemplary embodiment of the invention, a base-band method of encoding, transmitting and decoding data over a wireless medium, comprising:

selecting a number of bits N representing a symbol;

creating a set of at least 2 to the power of N equal sized codewords with a larger number of bits than N, representing at least the 2 to the power of N possible combinations of N bit symbols;

receiving a stream of data;

replacing every N bit symbol from the stream of data with its representative codeword from the created set;

transmitting the codewords using a faster transmission bit rate such that the transmission time allocated for each codeword is substantially the same as the time duration required to transmit the original bits it replaced;

wherein each codeword is selected to enable demodulation, decoding, detection and correction of at least one inverted bit error in the codeword by a receiver to obtain the originally transmitted symbol; and wherein each codeword is selected to enable demodulation, decoding, detection and correction of any fall bit jitter error in the codeword by a receiver to obtain the originally transmitted symbol.

In some embodiments of the invention, each codeword is constructed from an integer number of elements, termed super-bits, each comprising three bits of the form '000' or '010'. Optionally, each codeword comprises at least one super-bit with the value '010'.

In some embodiments of the invention, none of the codewords have two successive super-bits with the value '010'. Optionally, the maximum number of ON ('1') bits within a codeword is not more than 16.66% of the overall bits in a codeword in the most densely bit populated codeword.

In some embodiments of the invention, each codeword of the set differs from all the other codewords of the set such that at least three bit value inversions are required for one codeword to turn into another codeword. Optionally, the number of super-bits in the codewords is the minimum number that meet the following limitations:

a. each codeword comprises at least one super-bit with the value '010';

b. none of the codewords have two successive super-bits with the value '010';

c. each codeword of the set differs from all the other codewords of the set such that at least three super-bit value inversions are required for one codeword to turn into another codeword.

In some embodiments of the invention, the receiver detects and corrects simultaneously one inverted super-bit error in a received transmission and additionally any fall bit position jitter error. Optionally, the wireless medium is the optical infrared medium.

In some embodiments of the invention, the set of codewords comprises two to the power of N codewords. Optionally, the set of codewords comprises more than two to the power of N codewords.

In some embodiments of the invention, some code-words of the set of codewords are used for control purposes. Optionally, N equals 2. Alternatively, N is greater than 2.

In some embodiments of the invention, the faster transmission bit rate is achieved by reducing the time duration for transmitting an ON ('1') bit value. Optionally, the decoding process uses a look up table for detecting and correcting errors.

In some embodiments of the invention, the decoding process uses Boolean logic for detecting and correcting errors.

Optionally, the decoding process produces a default symbol if the errors within a codeword are uncorrectable.

In some embodiments of the invention, the demodulation and decoding are performed simultaneously.

There is thus additionally provided according to an exemplary embodiment of the invention, a wireless optical communication system, comprising:

a wireless transmitter;

one or more wireless receivers;

wherein the wireless transmitter receives a stream of data and encodes and modulates it for transmission to the one or more wireless receivers; and wherein the encoding comprises:

selecting a number of bits N comprising a symbol;

creating a set of at least 2 to the power of N equal sized code-words with a larger number of bits than N, representing 2 to the power of N possible combinations of N bit symbols;

receiving a stream of data;

replacing every N bit symbol from the stream of data with its representative codeword from the created set;

transmitting the codewords using a faster transmission bit rate such that the transmission time allocated for each codeword is substantially the same as the time duration required to transmit the original bits it replaced;

wherein each codeword is selected to enable demodulation, decoding, detection and correction of at least one inverted bit error in the codeword by a receiver to obtain the originally transmitted symbol; and wherein each codeword is selected to enable demodulation, decoding, detection and correction of any fall bit jitter error in the codeword by a receiver to obtain the originally transmitted symbol.

In some embodiments of the invention, the optical wireless communication system uses the infrared wavelength. Optionally, the demodulation and decoding are performed simultaneously.

BRIEF DESCRIPTION OF THE DRAWINGS

The present invention will be understood and appreciated more fully from the following detailed description taken in conjunction with the drawings. Identical structures, elements or parts, which appear in more than one figure, are generally labeled with a same or similar number in all the figures in which they appear, wherein:

FIG. 3 is an exemplary codeword encoding for a 2-bit symbol, according to an exemplary embodiment of the invention;

FIG. 4 is a table of the possible values for a received encoded wireless signal on a super-bit level, and the most probable original symbol it represents based on comparison to all possible original codewords, and decision according to minimal number of errors received, according to an exemplary embodiment of the invention; and FIG. 5 is a list of a family of 20 sets of 4 codewords, which conform to specific limitations, according to an exemplary embodiment of the invention.

DETAILED DESCRIPTION OF THE INVENTION

Figure 1:
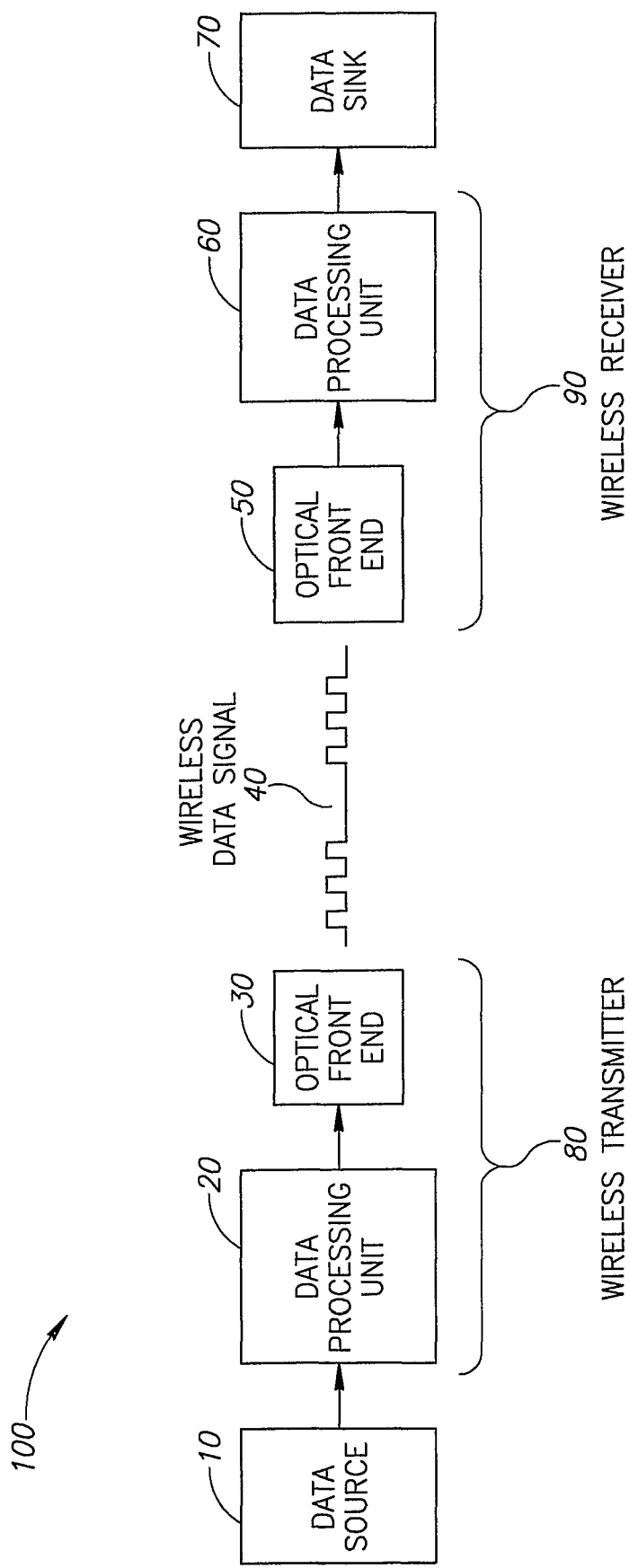
FIG. 1 is a schematic illustration of a wireless communication system, according to an exemplary embodiment of the invention.

FIG. 1 is a schematic illustration of a wireless optical communication system 100, according to an exemplary embodiment of the invention. In an exemplary embodiment of the invention, system 100 comprises an IR wireless transmitter 80 and an IR wireless receiver 90. Optionally, IR wireless transmitter 80 receives data from a data source 10 and transmits a wireless data signal 40 to IR wireless receiver 90. In an exemplary embodiment of the invention, wireless data signal 40 may be affected by physical phenomenon, for example ambient natural or artificial light in the room or enclosure, or the distance between the transmitter and receiver, causing attenuation to wireless data signal 40 and thus errors in the signal received by IR wireless receiver 90. In an exemplary embodiment of the invention, wireless data signal 40 is encoded using a robust modulation and encoding method, comprising codewords, which replace a specific number of bits (e.g. symbols) of the original data. The robust encoding method enables IR wireless receiver 90 to demodulate and detect the presence of errors in the received signal and correct some errors, for example inter symbol interference (ISI) and/or inversion of one or more bits per codeword. In an exemplary embodiment of the invention, IR wireless receiver 90 demodulates and detects and corrects the received wireless data signal 40 and passes it on to a data sink 70 of a device in which it is embedded.

In an exemplary embodiment of the invention, IR wireless transmitter 80 comprises a data processing unit 20 and an optical front end 30. Optionally, data processing unit 20 accepts the data from data source 10, processes the data (e.g. provides for further digital signal processing, framing of the data, appending various control bits, etc.), and then modulates and encodes the data and provides the data to an optical front end 30 to transmit the data as wireless data signal 40 to IR wireless receiver 90. In an exemplary embodiment of the invention, optical front end 30 comprises elements for transmitting an infrared light signal as is known in the art, for example lasers, laser diodes or light emitting diodes (LEDs).

In an exemplary embodiment of the invention, IR wireless receiver 90 comprises an optical front end 50 to receive wireless data signal 40. Optionally, optical front end 50 comprises elements for receiving an infrared light signal as is known in the art, for example light sensitive photodiode sensors. Optical front end 50 receives wireless signal 40 and provides this signal to a data processing unit 60 for decoding and demodulation, and then optionally for further processing (e.g. stripping the control bits and acting accordingly, de-framing, and additional digital signal processing) in order to fully reconstruct the original data received from data source 10.

Figure 2:
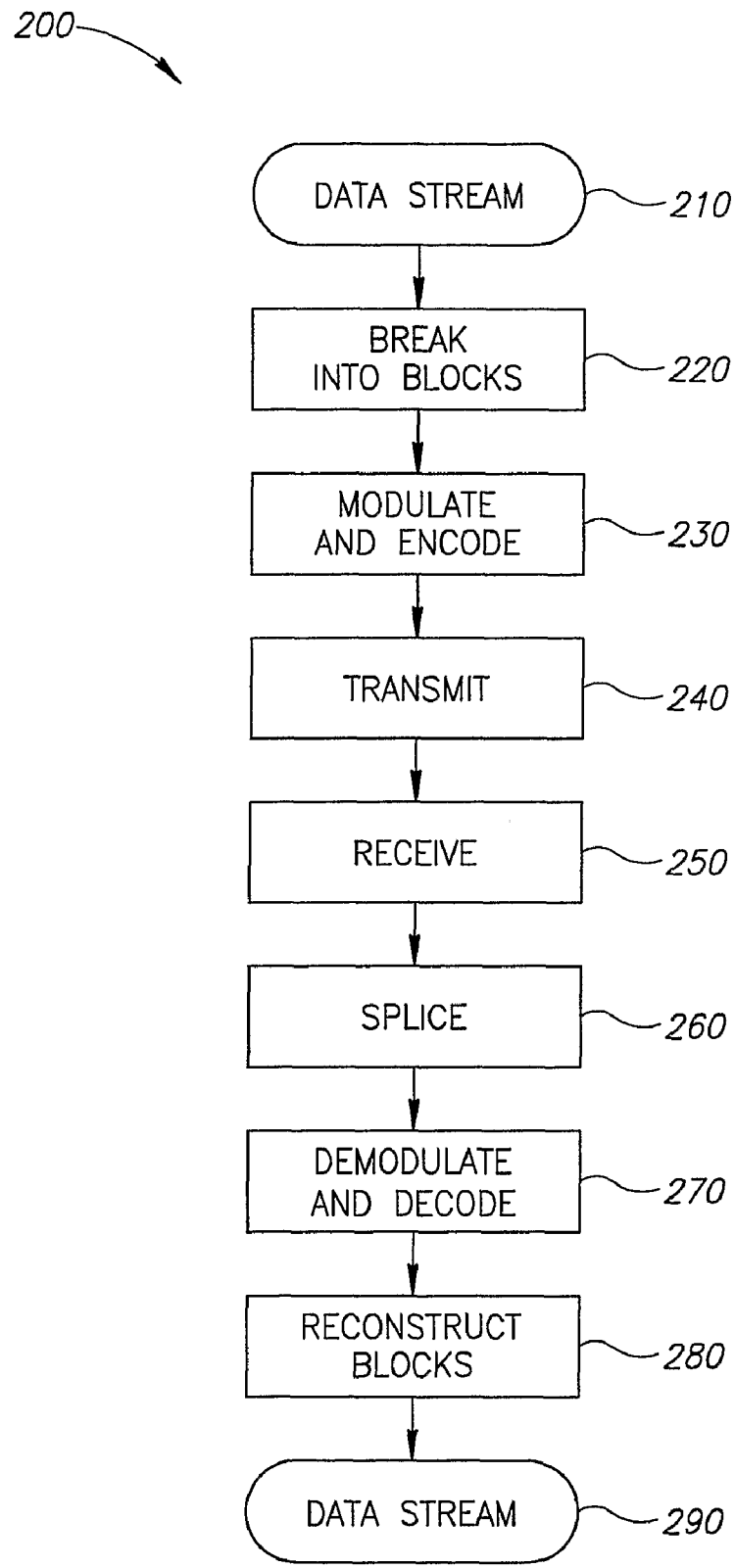
FIG. 2 is a flow diagram of the process of transmitting and receiving data according to an exemplary embodiment of the invention.

FIG. 2 is a flow diagram 200 of the process of transmitting and receiving data according to an exemplary embodiment of the invention. In an exemplary embodiment of the invention, a data stream 210 is provided by data source 10 to IR wireless transmitter 80. Optionally, data processing unit 20 breaks (220) the data stream into finite blocks, for example of 4, 8, 16 or 128 or more bits to enable modulation and encoding of the data. In prior art systems these blocks would be encoded for example using a FEC encoding method (e.g. typically using redundant parity bits), and then modulated for transmission, for example using PPM. Typically, in transmission as a wireless data signal 40, over the noisy wireless medium, some of the data bits would be damaged by noise and interference, possibly resulting in meaningless codewords (e.g. all zeros). In such a case this type of FEC technique cannot work, as initial demodulation is impossible, and a more robust solution, possibly than PPM is required (e.g. transmitting additional code-words to perform parity checks between codewords).

In an exemplary embodiment of the invention, a code, which provides simultaneous modulation and encoding, is incorporated to enable robust base-band communication (230). In an exemplary embodiment of the invention, each N bits (referred to as a symbol) within a block are converted to a codeword with a larger number of chips L (wherein a chip represents a bit value with a shorter transmission pulse duration) to enable modulation of the wireless data signal 40 over the wireless medium. Additionally, the codeword encoding enables demodulation, error detection and error correction at IR wireless receiver 90. The method of implementing the code incorporates transmission of the L chips at a higher rate and bandwidth such that the mapped codeword is transmitted in the same time frame duration as the original N bits, for example 2 bits are encoded as a code-word of 18 chips where each chip is transmitted at a time duration of N/L=2/18=⅑ of a bit, (i.e. at a rate of 9 times faster than a bit). Similarly the energy used for transmission of a '1' value chip is likewise proportional to the energy used to transmit a bit (e.g. ⅑ of the energy).

In an exemplary embodiment of the invention, the codewords are transferred to optical front end 30 and transmitted (240) as wireless data signal 40. Optionally, the transmissions are received (250) by optical front end 50 of an IR wireless receiver 90 and provided to data processing unit 60 of IR wireless receiver 90.

In an exemplary embodiment of the invention, data processing unit 60 splices (260) the incoming wireless data signal 40 into codewords and then demodulates and decodes (270) the codewords back into symbols. Optionally, decoding includes detection and correction of inter symbol interference and/or fall chip position jitter as well as chip inversion errors, for example chip inversion resulting from a foreign pulse or pulse erasure.

In an exemplary embodiment of the invention, after simultaneously demodulating and decoding codewords into original symbols and correcting codeword errors, the original data blocks are reconstructed (280) to reproduce data stream 290, which is identical to data stream 210.

In an exemplary embodiment of the invention, using the above method with the encoding and decoding scheme described below will enable system 100 to overcome a first level of errors, for example one single chip inversion in each codeword and all full chip position jitter of '1' value chips. Optionally, additional data for error correction purposes can be added to each block or to every few blocks in order to allow correction of errors in addition to these errors. In an exemplary embodiment of the invention, using the above method and encoding and decoding scheme, enables extension of the range in using system 100 and/or enables usage of system 100 in less favorable conditions, for example when it is immersed in strong ambient light.

In the following description, the modulation and encoding method are described in more detail. FIG. 3 is an exemplary 18 chip codeword encoding for an original symbol comprised of 2 bits, according to an exemplary embodiment of the invention. In an exemplary embodiment of the invention, each of the four possible symbol values is represented by a sequence of six bit values. Optionally, each value in the six bit value sequence is referred to as a super-bit wherein a zero ('0') value is replaced by a '000' chip sequence, and a one ('1') value is replaced by '010' chip sequence, thus forming an 18 chip code-word to represent the symbol comprised of 2 original data bits.

In an exemplary embodiment of the invention, each codeword is characterized by:

1. Comprising at least one '1' value super-bit per codeword to prevent long runs of zeros.

2. Limiting the average number of '1' value super-bits in the aggregate of all 4 codewords to 2, giving a total of eight '1' value super-bits for all the code-words. This minimizes the energy required to transmit the base-band wireless data signal using the codewords, producing a '1' value chip average duty cycle of a little more than 11%, since 8/72 chip values=⅑, where 72=4×18. The duty cycle is defined as the ratio between the sum of the '1' value chips in all of the codewords relative to the total number of chips in all of the codewords.

3. Limiting the maximum number of '1' chips in each codeword to 3, in order to keep a pre determined maximum limit on the energy required to transmit a codeword, as is typically required by wireless communication systems. Each '1' value chip in the codeword has ⅑ of the energy of a '1' ON bit value. The above limitation results in a low duty cycle for transmission of data, producing a maximum duty cycle of 16.66% in data, which is entirely comprised of the most densely chip populated codeword.

4. Differentiating between each codeword and all other codewords such that at least 3 chip value inversions are required for a codeword to turn into another codeword (this is referred to as a Hamming Distance of 3). As a result, any codeword with one chip inversion can be demodulated, detected and corrected, since it will differ from the other codewords by requiring at least two more inversions.

5. Each '1' value chip is preceded and proceeded by a '0' value chip, thus constructing a '1' super-bit, to allow the decoder to identify the '1' value chip, even if it has fully jittered to the left or right chip position, enabling to correct this type of error. Optionally, jitter correction is in addition to correction of an additional single error produced by bit inversion such as pulse erasure or the appearance of a foreign pulse.

6. No codeword has two consecutive '1' value super-bits. This limitation decreases the probability of errors appearing over the wireless channel, since then there is a minimum distance (e.g. 5 '0' value chips) between the '1' value chips within the codewords and the effects of ISI are minimized. When transmitted over the wireless medium the '1' value chips resume an analog domain representation. In the analog domain, these chips are pulses that have an analog "tail" remaining active after the chip duration time. When the '1' value chips are too close together, the tail of a '1' value chip might adversely affect the next '1' value chip and distort it causing ISI and/or other errors. In the case of the codewords shown in FIG. 3 consecutive '1' value super-bits occur only if the codewords representing symbol '11' or symbol '10' follow the codeword representing symbol '01'. The probability of such a combination is statistically lower than the appearance of consecutive '1' value super-bits if they were allowed within a codeword.

It should be noted that the code presented in FIG. 3 is one of many possible combinations that satisfy the above conditions; therefore other sets of 4 codewords, which conform to the above requirements, are possible.

FIG. 5 is a list of a family of 20 sets of 4 codewords for N=2, which conform to the above limitations, according to an exemplary embodiment of the invention.

In an exemplary embodiment of the invention, the above encoding concepts are applicable to 3 bit symbols, 4 bit symbols or any other number of bits per symbol. In the general case a code of the following form is required:

1. Comprising $2^N$ (2 to the power of N) codewords representing the $2^N$ possible combinations of N bit symbols.

2. Each codeword comprises J super-bits where J is a pre-selected number of super-bits for which a set of $2^N$ codewords can be found that meet the following requirements:

a. Each codeword includes at least one '1' value super-bit.
b. Each codeword differs from all the other codewords such that at least three chip inversions within 3 super-bits are required in order for one codeword to turn into another codeword (e.g. the codewords have a Hamming Distance of 3).
c. There are no successive '1' value super-bits in any codeword.

In some embodiments of the invention, J is selected as the minimal number, which meets the above requirements, in order to minimize bandwidth requirements. Optionally, the bigger the value of J, the shorter the width of the '1' value chip and the lower their energy. Shorter '1' value chips require a higher bandwidth and faster and more expensive communication elements to be used by the transceiver.

In some embodiments of the invention, one or more codewords are added to a codeword set of $2^N$ codewords to allow the transfer of control information.

In an exemplary embodiment of the invention, a received codeword is decoded by determining the N bit symbol it represented. FIG. 4 is a table of the possible values for a received encoded wireless data signal over the wireless medium using the code of FIG. 3 (represented in super-bit form with 6 super-bit values), and the most probable 2-bit symbol it represents, according to an exemplary embodiment of the invention. Optionally, a received signal is decoded by looking it up in the table in FIG. 4.

In some embodiments of the invention, decoding is based on comparing the encoded received codeword (in super-bit form) to the super-bit representation of all possible original codewords, and deciding which codeword was intended by selecting the codeword which requires the minimal amount of errors to transform into the received codeword, for example the minimal number of bit inversions required for the received codeword to turn into each of the original codewords. Once the intended code-word is determined it is readily converted into the original symbol from the data stream. In some embodiments of the invention, a set of Boolean equations is formed as is known in the art, to simplify the decision process. Optionally, instead of comparing the received codeword to a table (e.g. as shown in FIG. 4), the chip values of the codeword are provided to the Boolean equations and the result of the equations is the original symbol, which should be selected responsive to the codeword.

In an exemplary embodiment of the invention, a wireless data signal 40 encoded as described above that is transmitted over a noisy wireless medium may suffer from full chip position jitter and/or bit inversion. Optionally, the use of super-bits allows complete detection and correction of full chip position jitter since the reception of an invalid super-bit value (e.g. with the '1' chip value shifted over one chip position to the right or to the left) is easily corrected. Optionally, inversion of the value of a legal super-bit (e.g. from '000' to '010' or '010' to '000') is handled as described above by comparing the difference between the received encoded signal (as shown in FIG. 4) and all the original legal codewords, or using a Boolean equation. By assuming that the erroneous codeword has a minimal amount of super-bit errors (e.g. 1) with respect to comparison to all other original codewords, many such encoded erroneous codewords can be corrected.

In an exemplary embodiment of the invention, some received encoded signals differ from all the codewords by more than one super-bit inversion error. Optionally, such an error can either be corrected by selecting the closest codeword or one of the closest codewords. Alternatively, system 100 can handle such a case as an error, which is discarded or needs to be retransmitted. Alternatively system 100 can select a constant symbol (out of the $2^N$ possible symbols) to be decoded in the event it cannot select a meaningful decoded symbol. With a 2-bit symbol this will yield on the average a 25% success rate. It should be noted that some types of data and information content could tolerate an occasional erroneous value (e.g. audio or video data). In contrast some systems cannot tolerate errors and will require correcting the error (e.g. by retransmission), or will give indication to the user that the system cannot function, for example an IR wireless receiver 90 will turn on a LED indicating that the reception failed.

In some embodiments of the invention, an optimal robust set of codewords is replaced by a sub-optimal robust set of codewords by removing one or more chips, which have a '0' value in the same chip position in all the codewords. Optionally, this reduces the number of chip values transmitted per codeword and thus the required bandwidth at the price of the robustness of the code. An example of such a code with 16 chips instead of 18 chips per codeword is produced by using the 6 super-bit code in FIG. 3, wherein the code is expanded to 16 chips instead of 18 chips by removing the '0' value chips next to last super-bit. Optionally, the next to last super-bit will share the surrounding '0' value chips of its neighbors for error detection and correction. In contrast to the 18 chip code the 16 chip code is more limited in correcting errors, such as fall chip position jitter or chip inversion errors, as a result of the removed '0' chip values.

It should be appreciated that the above described methods and apparatus may be varied in many ways, including omitting or adding steps, changing the order of steps and the type of devices used. It should be appreciated that different features may be combined in different ways. In particular, not all the features shown above in a particular embodiment are necessary in every embodiment of the invention. Further combinations of the above features are also considered to be within the scope of some embodiments of the invention.

Section headings are provided for assistance in navigation and should not be considered as necessarily limiting the contents of the section.

It will be appreciated by persons skilled in the art that the present invention is not limited to what has been particularly shown and described hereinabove. Rather the scope of the present invention is defined only by the claims, which follow.

The invention claimed is:

1. A base-band method of encoding, transmitting and decoding data over a wireless medium, comprising:
   selecting a number of bits N representing a symbol;
   creating a set of at least 2 to the power of N equal sized codewords with a larger number of bits than N, representing the 2 to the power of N possible combinations of N bit symbols, wherein each codeword is constructed from an integer number of elements, termed super-bits, each comprising three bits of the form '000' or '010';
   receiving a stream of data;
   replacing every N bit symbol from said stream of data with the N bit symbol's representative codeword from said created set;
   transmitting said codewords over the wireless medium using a faster transmission bit rate such that the transmission time allocated for each codeword is the same as the time duration required to transmit the N bit symbol the codeword replaced;
   splicing the incoming stream of bits at the receiver into sets of bits of equal length the size of a codeword;
   comparing the difference between each received set of bits the size of a codeword and the possible codewords, wherein said comparing divides the sets of bits of equal length the size of a codeword into an integer number of three bit elements and treats a three bit element with a '1' value in any of the three bits as a super-bit with the value of '010';
   decoding each received set of bits of equal length the size of a codeword back into an N bit symbol, by selecting responsive to said comparing the N bit symbol corresponding to the codeword having a minimal difference between the codeword and the received set of bits of equal length the size of a codeword.

2. A method according to claim 1, wherein each codeword comprises at least one super-bit with the value '010'.

3. A method according to claim 1, wherein none of the codewords have two successive super-bits with the value '010'.

4. A method according to claim 1, wherein the maximum number of ON ('1') bits within a codeword is not more than 16.66% of the overall bits in a codeword in the most densely bit populated codeword.

5. A method according to claim 1, wherein each codeword of said set differs from all the other codewords of said set such that at least three bit value inversions are required for one codeword to turn into another codeword.

6. A method according to claim 1, wherein the number of super-bits in the codewords is the minimum number that meets the following limitations:
   a. each codeword comprises at least one super-bit with the value '010';
   b. none of the codewords have two successive super-bits with the value '010';
   c. each codeword of said set differs from all the other codewords of said set such that at least three super-bit value inversions are required for one codeword to turn into another codeword.

7. A method according to claim 1, wherein said receiver detects and corrects simultaneously one inverted bit error and additionally all ON ('1') full bit position jitter errors within a super-bit in a received codeword.

8. A method according to claim 1, wherein the wireless medium is the optical infrared medium.

9. A method according to claim 1, wherein said set of codewords comprises two to the power of N codewords.

10. A method according to claim 1, wherein said set of codewords comprises more than two to the power of N codewords.

11. A method according to claim 10, wherein some codewords of said set of codewords are used for control purposes.

12. A method according to claim 1, wherein N equals 2.

13. A method according to claim 1, wherein N is greater than 2.

14. A method according to claim 1, wherein said decoding process uses a look up table for detecting and correcting errors.

15. A method according to claim 1, wherein said decoding process uses Boolean logic for detecting and correcting errors.

16. A method according to claim 1, wherein said decoding process produces a default symbol if the errors within a codeword are uncorrectable.

17. A wireless communication system, comprising:
   a wireless transmitter;
   one or more wireless receivers;
   wherein said wireless transmitter is adapted to receive a stream of data and also adapted to encode and modulate the stream of data for transmission to said one or more wireless receivers; and wherein said encoding comprises:

selecting a number of bits N representing a symbol;

creating a set of at least 2 to the power of N equal sized codewords with a larger number of bits than N, representing the 2 to the power of N possible combinations of N bit symbols, wherein each codeword is constructed from an integer number of elements, termed super-bits, each comprising three bits of the form '000' or '010';

receiving a stream of data;

replacing every N bit symbol from said stream of data with the N bit symbol's representative codeword from said created set;

transmitting said codewords over the wireless medium using a faster transmission bit rate such that the transmission time allocated for each codeword is the same as the time duration required to transmit the N bit symbol the codeword replaced;

splicing the incoming stream of bits at the receiver into sets of bits of equal length the size of a codeword;

comparing the difference between each received set of bits the size of a codeword and the possible codewords, wherein said comparing divides the sets of bits of equal length the size of a codeword into an integer number of three bit elements and treats a three bit element with a '1' value in any of the three bits as a superbit with the value of '010';

decoding each received set of bits of equal length the size of a codeword back into an N bit symbol, by selecting responsive to said comparing the N bit symbol corresponding to the codeword having a minimal difference between the codeword and the received set of bits of equal length the size of a codeword.

18. A system according to claim 17, wherein said wireless communication system is adapted to use the optical infrared wavelengths.

* * * * *